(12) United States Patent
Cheng et al.

(10) Patent No.: US 11,233,045 B2
(45) Date of Patent: Jan. 25, 2022

(54) TRANSIENT VOLTAGE SUPPRESSION DEVICE AND MANUFACTURING METHOD THEREFOR

(71) Applicant: CSMC TECHNOLOGIES FAB2 CO., LTD., Wuxi (CN)

(72) Inventors: Shikang Cheng, Wuxi (CN); Yan Gu, Wuxi (CN); Sen Zhang, Wuxi (CN)

(73) Assignee: CSMC TECHNOLOGIES FAB2 CO., LTD., Jiangsu (CN)

( * ) Notice: Subject to any disclaimer, the term of this patent is extended or adjusted under 35 U.S.C. 154(b) by 0 days.

(21) Appl. No.: 17/265,541

(22) PCT Filed: Sep. 4, 2019

(86) PCT No.: PCT/CN2019/104395
§ 371 (c)(1),
(2) Date: Feb. 3, 2021

(87) PCT Pub. No.: WO2020/043218
PCT Pub. Date: Mar. 5, 2020

(65) Prior Publication Data
US 2021/0313312 A1 Oct. 7, 2021

(30) Foreign Application Priority Data

Aug. 31, 2018 (CN) .......................... 201811014100.4

(51) Int. Cl.
*H01L 27/02* (2006.01)
*H01L 29/06* (2006.01)
(Continued)

(52) U.S. Cl.
CPC ...... *H01L 27/0255* (2013.01); *H01L 27/0296* (2013.01); *H01L 29/0611* (2013.01); *H01L 29/66106* (2013.01); *H01L 29/866* (2013.01)

(58) Field of Classification Search
CPC ............. H01L 27/0255; H01L 29/0611; H01L 29/66106; H01L 29/866; H01L 27/0296
(Continued)

(56) References Cited

U.S. PATENT DOCUMENTS

| 6,762,440 B1 * | 7/2004 | Pairitsch | ............. H01L 27/0255 257/173 |
| 8,169,000 B2 | 5/2012 | Chuang et al. | |

(Continued)

FOREIGN PATENT DOCUMENTS

| CN | 102290417 A | 12/2011 |
| CN | 103354236 A | 10/2013 |

(Continued)

OTHER PUBLICATIONS

PCT International Search Report for corresponding PCT Application No. PCT/CN2019/104395, dated Dec. 2, 2019, 4 pages.

*Primary Examiner* — Sheikh Maruf
(74) *Attorney, Agent, or Firm* — Dority & Manning, P.A.

(57) ABSTRACT

A transient voltage suppression device includes a substrate; a first conductivity type well region disposed in the substrate and comprising a first well and a second well; a third well disposed on the substrate, a bottom part of the third well extending to the substrate; a fourth well disposed in the first well; a first doped region disposed in the second well; a second doped region disposed in the third well; a third doped region disposed in the fourth well; a fourth doped region disposed in the fourth well; a fifth doped region extending from inside of the fourth well to the outside of the fourth well, a portion located outside the fourth well being located in the first well; a sixth doped region disposed in the first well; a seventh doped region disposed below the fifth doped region and in the first well.

15 Claims, 4 Drawing Sheets

(51) Int. Cl.
*H01L 29/66* (2006.01)
*H01L 29/866* (2006.01)

(58) Field of Classification Search
USPC .......................................................... 257/367
See application file for complete search history.

(56) References Cited

U.S. PATENT DOCUMENTS

| | | | | |
|---|---|---|---|---|
| 2001/0009287 A1* | 7/2001 | Fujihira | .............. | H01L 29/7808 257/328 |
| 2005/0012156 A1* | 1/2005 | Yeh | ..................... | H01L 27/0255 257/367 |
| 2005/0156267 A1* | 7/2005 | Mori | ................... | H01L 29/7804 257/467 |
| 2007/0158750 A1* | 7/2007 | Glaser | ................. | H01L 27/0814 257/367 |
| 2010/0148268 A1* | 6/2010 | Noguchi | ............. | H01L 29/7811 257/367 |
| 2016/0020276 A1* | 1/2016 | Lu | ....................... | H01L 29/0649 257/77 |
| 2017/0047321 A1* | 2/2017 | Nishimura | .......... | H01L 27/0727 |
| 2018/0006639 A1* | 1/2018 | Sander | .................... | H01L 24/05 |
| 2018/0061823 A1* | 3/2018 | Weyers | .............. | H01L 27/0727 |
| 2018/0108764 A1* | 4/2018 | Ishii | .................... | H01L 29/7393 |
| 2020/0091135 A1* | 3/2020 | Nishimura | .......... | H01L 29/0638 |
| 2020/0091139 A1* | 3/2020 | Iwamizu | ........... | H01L 23/49575 |

FOREIGN PATENT DOCUMENTS

| | | |
|---|---|---|
| CN | 103413807 A | 11/2013 |
| CN | 106486474 A | 3/2017 |

* cited by examiner

TRANSIENT VOLTAGE SUPPRESSION DEVICE AND MANUFACTURING METHOD THEREFOR

CROSS-REFERENCE TO RELATED APPLICATIONS

This application is a National Stage of International Application No. PCT/CN2019/104395, filed on Sep. 4, 2019, which claims priority to Chinese Patent Application No. 201811014100.4, filed on Aug. 31, 2018. Both of the aforementioned applications are hereby incorporated by reference in their entireties.

TECHNICAL FIELD

The present disclosure relates to the field of semiconductor manufacture, particularly to a transient voltage suppression device, and to a method for manufacturing a transient voltage suppression device.

BACKGROUND

Unexpected voltage transients and surges are often encountered in the whole machine and system, causing semiconductor devices in the whole machine and system to be burned or broken down, thereby resulting in damage to the whole machine and system. Therefore, transient voltage suppressors (TVS), as a highly effective protection device with PN-junction, are widely used for various I/O interfaces due to their rapid response and high withstand against the ESD. Currently, the transmission speed of high-speed interfaces, represented by high-definition multimedia interfaces (HDMI), becomes faster and faster, even up to 5 Gbps. In order to ensure the integrity of data, the requirements for capacitors against ESD arranged at interfaces are extremely strict. In addition, the number of pins in a practical drive chip is up to hundreds. Each of the pins is threated by the ESD. In order to protect the I/O interfaces as many as possible without taking up too large area, the requirements for the integration of TVS becomes higher.

A conventional TVS consistent of a single avalanche diode has a comparably large capacitance, which is generally at least dozens of picofarads. The capacitance value increases proportionally as the increase of the capability of the ESD. A high capacitance value for high-speed interfaces will critically affect the integrity of data. The solution is generally to connect in series a diode having a low capacitance to the avalanche diode of the TVS to realize a one-way TVS having a low capacitance.

In a structure of a conventional transient voltage suppression device, the front surface and the back surface of the chip need to introduce metal electrodes for grounding. When encapsulating, the electrodes on the front surface and on the back surface are generally short-circuited by metal wires and are simultaneously connected to the ground. As such, the length of the metal bonding wire increases, thereby resulting in the increase of the parasitic resistance and the inductance thereof, so that the chip performance will decrease under the operation at high frequency.

SUMMARY

In view of above, it is necessary to provide a transient voltage suppression device having a new structure, and a method for manufacturing the same.

A transient voltage suppression device is provided, including a substrate, the substrate being of a second conductivity type; a first conductivity type well region disposed on the substrate and including a first well and a second well; a third well disposed on the substrate and being of the second conductivity type, a bottom of the third well extending to the substrate; the first conductivity type and the second conductivity type being conductivity types opposite to each other; a fourth well disposed in the first well and being of the second conductivity type; isolation structures, the isolation structures including a first isolation portion disposed between the first well and the second well, and a second isolation portion disposed between the first well and the third well, the first isolation portion being adapted to isolate the first well and the second well from each other, and the second isolation portion being adapted to isolate the first well and the third well from each other; a first doped region being of a first conductivity type and disposed in the second well; a second doped region being of the second conductivity type and disposed in the third well; a third doped region being of the second conductivity type and disposed in the fourth well; a fourth doped region being of the first conductivity type and disposed in the fourth well; a fifth doped region being of the first conductivity type, extending from inside of the fourth well to outside of the fourth well, and a portion of the fifth doped region outside the fourth well being located in the first well; a sixth doped region being of the second conductivity type and disposed in the first well; a seventh doped region being of the second conductivity type and disposed under the fifth doped region and in the first well; the fifth doped region being disposed between the fourth doped region and the sixth doped region, and the fourth doped region being disposed between the third doped region and the fifth doped region; a metal connecting-wire layer including a first metal connecting-wire and a second metal connecting-wire and located on the substrate, the first metal connecting-wire being electrically connected to the first doped region and the sixth doped region as being used as a first potential terminal, the second metal connecting-wire layer being electrically connected to the second doped region, the third doped region and the fourth doped region as being used as a second potential terminal.

A method for manufacturing a transient voltage suppression device is provided. The method includes forming a mask layer on a substrate of a second conductivity type, and then performing lithography and etching the mask layer to expose a doping window of a second conductivity type well region; doping the substrate with second conductivity type ions through the doping window of the second conductivity type well region to form a second region on a surface of the substrate; growing an oxide layer as a doping blocking layer in the second region; removing the mask layer, and doping areas of the surface of the substrate not covered by the doping blocking layer with first conductivity type ions to form a first region; the first conductivity type and the second conductivity type being conductivity types opposite to each other; removing the doping blocking layer, and forming isolation structures, the isolation structures including a second isolation portion extending downwardly from an interface between the first region and the second region, and a first isolation portion dividing the first region into two portions; performing a thermal drive-in, so that the first region diffuses to form a first well and a second well which are spaced from each other by the first isolation portion, and the second region diffuses to form a third well; forming, by lithographing and doping, respectively a fourth well, a first doped region, a second doped region, a third doped region, a fourth doped region, a fifth doped region, a sixth doped region, and a seventh doped region; forming a metal connecting-wire layer on the substrate, the metal connecting-wire layer including a first metal connecting-wire and a second metal connecting-wire, the first metal connecting-wire electrically connecting the first doped region to the sixth doped region and serving as a first potential terminal, and the second metal connecting-wire electrically connecting the second doped region, the third doped region and the fourth doped region to each other and serving as a second potential terminal; wherein the fourth well is of the second conductivity type, and is formed in the first well; the first doped region is of the first conductivity type, and is formed in the second well; the second doped region is of the second conductivity type, and is formed in the third well; the third doped region is of the second conductivity type, and is formed in the fourth well; the fourth doped region is of the first conductivity type, and is formed in the fourth well; the fifth doped region is of the first conductivity type, extends from inside of the fourth well to outside of the fourth well, and a portion of the fifth doped region outside the fourth well is located in the first well; the sixth doped region is of the second conductivity type, and is formed in the first well; a seventh doped region is of the second conductivity type, and is formed under the fifth doped region and in the first well; and the fifth doped region is formed between the fourth doped region and the sixth doped region, and the fourth doped region is formed between the third doped region and the fifth doped region.

BRIEF DESCRIPTION OF THE DRAWINGS

In order to better describe and illustrate the embodiments and/or examples of the disclosures herein, one or more figures can be referred to. The additional details or examples for illustrating the drawings should not be deemed as limiting the scope of any of the disclosures, the currently described embodiments and/or examples, and the best mode of the disclosures currently understood.

DETAILED DESCRIPTION OF THE EMBODIMENTS

Figure 1:
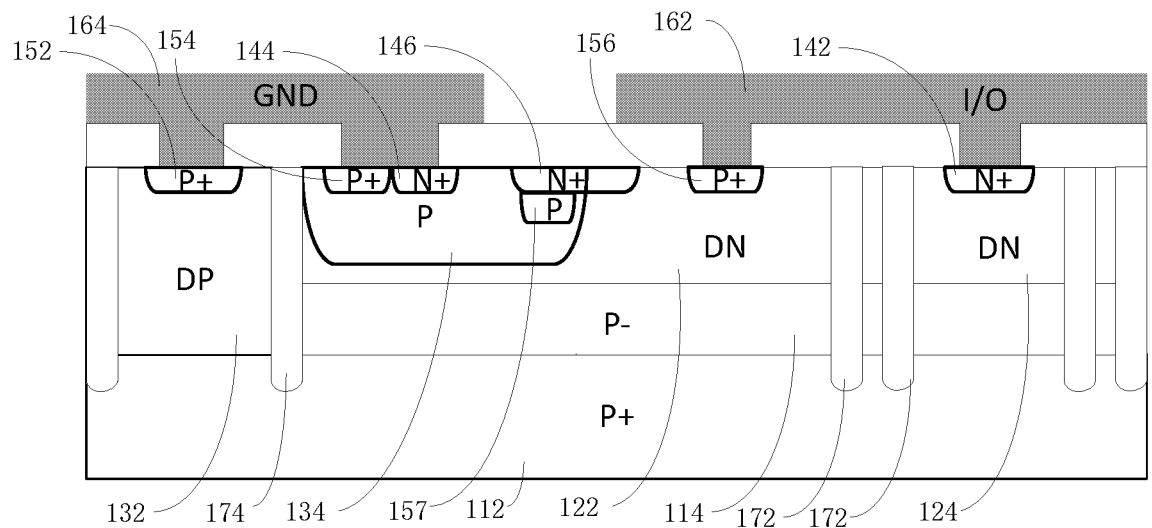
FIG. 1 is a structure diagram illustrating a transient voltage suppression device according to an embodiment.

In order to facilitate the understanding of the present disclosure, the present disclosure will be described in detail in connection with the related drawings. The preferred embodiments of the present disclosure are shown in the accompanying drawings. However, the present disclosure can be implemented in different forms, and not limited to the embodiments described herein. In contrast, the object to provide these embodiments is to make the content of the present disclosure more thorough.

Unless otherwise defined, all technical and scientific terms used herein have the same meaning as those commonly understood by those skilled in the technical field with respect to the present disclosure. The terms used in the specification of the present disclosure herein are only for the purpose of describing specific embodiments, and are not intended to limit the present disclosure. The term "and/or" as used herein includes any and all combinations of one or more related listed items.

It should be understood that when an element or layer is referred to as being "on", "adjacent to", "connected to" or "coupled to" other elements or layers, it can be directly on, directly adjacent to, directly connected to, or directly coupled to the other elements or layers, or intervening elements or layers may be present. In contrast, when an element is referred to as being "directly on", "directly adjacent to", "directly connected to" or "directly coupled to" other elements or layers, no intervening elements or layers is present. It should be understood that although the terms "first", "second", "third", and the like, may be used to describe various elements, components, regions, layers, and/or sections, these elements, components, regions, layers and/or sections should not be limited by these terms. These terms are used only to distinguish one element, component, region, layer, or section from another element, component, region, layer, or section. Therefore, a first element, component, region, layer, or section discussed below can also be represented by a second element, component, region, layer, or section without departing from the teaching of the present disclosure.

Spatial relationship terms such as "under", "below", "underlying", "underneath", "on", "above", and the like, can be used here for the convenience of description to describe the relationship between one element or feature to other elements or features shown in the figures. It should be understood that, in addition to the orientations shown in the figures, the spatial relationship terms are intended to include different orientations of devices in use and operation. For example, if the device in the figures is inversed, then elements or features described as "under" or "below" or "underneath" other elements will be oriented "on" the other elements or features. Therefore, the exemplary terms "under" and "below" can include both orientations of "on" and "under". The device can be otherwise oriented (rotated by 90 degrees or other orientations) and the spatial description languages used here are interpreted accordingly.

The purpose of the terms used here is only to describe specific embodiments and not construed as limitations of the present disclosure. When used herein, the singular forms of "a", "an" and "the/this" are also intended to include plural forms, unless the context clearly indicates otherwise. It should also be understood that the terms "consisting of" and/or "comprising", when used in this specification, determine the presence of the described features, integers, steps, operations, elements and/or components, but do not exclude the presence or addition of one or more other features, integers, steps, operations, elements, components and/or groups. As used herein, the term "and/or" includes any and all combinations of related listed items.

Embodiment of the present disclosure are illustrated here with reference to sectional diagrams of ideal embodiments (and intermediate structures) of the present disclosure. In such a way, a change in shape due to, for example, manufacturing processes and/or tolerances can be expected. Therefore, the embodiments of the present disclosure should not be limited to the specific shapes of the regions illustrated here, but include shape deviations due to, for example, manufacturing processes. For example, the implanted region shown as a rectangle usually has round or curved features at its edges and/or implant concentration gradients, rather than a binary change from an implanted region to a non-implanted region. Likewise, the formation of a buried region by implantation may result in some implantation in the regions between the buried region and a passed surface during the implantation. Therefore, the regions shown in the figures are substantially illustrative, and their shapes are not intended to show the actual shape of the regions of the device and are not intended to limit the scope of the present disclosure.

The semiconductor terms used herein are the technical terms commonly used by those skilled in the art. For example, for P-type impurities and N-type impurities, it is simply to use P+-type to represent P-type with heavily doping concentration, P-type to represent P-type with medium doping concentration, P--type to represent P-type with lightly doping concentration, N+-type to represent N-type with heavily doping concentration, N-type to represent N-type with medium doping concentration, and N--type to represent N-type with lightly doping concentration.

FIG. 1 is a structure diagram illustrating a transient voltage suppression device, including a substrate 112, a first well 122, a second well 124, a third well 132, a fourth well 134, a first isolation portion 172, a second isolation portion 174, a first doped region 142, a second doped region 152, a third doped region 154, a fourth doped region 144, a fifth doped region 146, a sixth doped region 156, a seventh doped region 157, a first metal connecting-wire 162, and a second metal connecting-wire 164.

The substrate 112 is of a second conductivity type. The first well 122, the second well 124, and the third well 132 are disposed on the substrate 112. The bottom of the third well 132 extends downwardly to the substrate 112. The fourth well 134 is disposed in the well 122.

The first isolation portion 172 is disposed between the first well 122 and the second well 124, and the second isolation portion 174 is disposed between the first well 122 and the third well 132. The first isolation portion 172 is adapted to isolate the first well 122 and the second well 124 from each other, and the second isolation portion 174 is adapted to isolate the first well 122 and the third well 132 from each other.

The first doped region 142 is of a first conductivity type, and is disposed in the second well 124. The second doped region 152 is of the second conductivity type, and is disposed in the third well 132. The third doped region 154 is of the second conductivity type, and is disposed in the fourth well 134. The fourth doped region 144 is of the first conductivity type, and is disposed in the fourth well 134. The fifth doped region 146 is of the first conductivity type, extending from inside of the fourth well 134 to outside of the fourth well 134, and a portion of the fifth doped region 146 outside the fourth well 134 is located in the first well 122. That is, a portion of the fifth doped region 146 is located in 134, and the other portion of the fifth doped region 146 is located in the first well 122 outside the fourth well 134. The sixth doped region 156 is of the second conductivity type, and is disposed in the first well 122. The seventh doped region 157 is of the second conductivity type, and is disposed under the fifth doped region 146 and in the first well 122. The fifth doped region 146 is disposed between the fourth doped region 144 and the sixth doped region 156, and the fourth doped region 144 is disposed between the third doped region 154 and the fifth doped region 146. In the embodiment shown in FIG. 1, the first conductivity type is N-type, and the second conductivity type is P-type. The substrate 112 is a heavily doped P-type (P+) substrate. The first well 122 and the second well 124 are N-wells, and the well regions of the third well 132 and the fourth well 134 are P-wells. In other embodiments, it is also possible that the first conductivity type is P-type, and the second conductivity type is N-type.

A metal connecting-wire layer is formed on the substrate. The metal connecting-wire layer includes a first metal connecting-wire 162 and a second metal connecting-wire 164. The first metal connecting-wire 162 is located on the substrate 112, and is electrically connected to the first doped region 142 and the sixth doped region 156, serving as a first potential terminal adapted to be electrically connected to an input/output terminal (I/O terminal). The second metal connecting-wire 164 is located on the substrate 112, and is electrically connected to the second doped region 152, the third doped region 154, and the fourth doped region 144, serving as a second potential terminal for grounding (GND).

Figure 2:
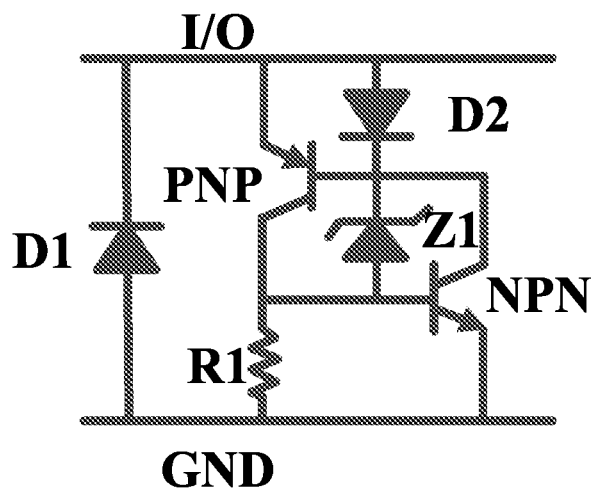
FIG. 2 is a schematic diagram illustrating an equivalent circuit to the transient voltage suppression device of FIG. 1.

FIG. 2 is a schematic diagram illustrating an equivalent circuit to the transient voltage suppression device of FIG. 1. The first doped region 142 is used as a cathode region of a diode D1. The second doped region 152 is used as an anode region of the diode D1. The sixth doped region 156 is used as an emitter region of a PNP transistor. The fifth doped region 146 is used as a base region of the PNP transistor (and is also used as a collector region of an NPN transistor and a cathode region of a zener diode Z1). The seventh doped region 157 is used as a collector region of the PNP transistor (and is also used as a base region of the NPN transistor and an anode region of the zener diode Z1). The fourth doped region 144 is used as an emitter region of the NPN transistor. Moreover, an equivalent parasitic resistance R1 is formed between the seventh doped region 157 and the third doped region 154, and an equivalent diode D2 is formed between the sixth doped region 156 and the fifth doped region 146. The PNP transistor and the NPN transistor are equivalent to a silicon-controlled rectifier (SCR).

The above-mentioned transient voltage suppression device can realize a protection on the circuit from the input/output terminal I/O to the ground GND. When a positive instant impulse signal is input through the input/output terminal I/O, the diode D1 and the zener diode Z1 are thus reversely biased. For a TVS product applied under a working voltage (VDD) of 5V, the withstand voltage of the zener diode Z1 is generally set to between 6V and 7V. Since the reverse breakdown withstand voltage of the diode D1 is very high while the reverse breakdown withstand voltage of the zener diode Z1 is relatively low, the PNP transistor will turn on firstly under the function of the positive impulse signal, where the collector current of the PNP transistor flows to the ground GND. However, a positive potential difference will be generated between the emitter and the base of the NPN transistor due to the existence of the parasitic resistance R1 in the area where a hole current flows. When the potential difference arrives at a certain value (for example, 0.7V to 0.8V), the NPN transistor will turn on, where a silicon-controlled rectifier composed of the PNP transistor and the NPN transistor will fully turn on, and the current leakage capability will become stronger. When a negative instant impulse signal is input through the input/output terminal I/O, since the diode D1 is forwardly biased and the PN junction of the PNP transistor is reversely biased, the signal flows first through the diode D1, and lastly to the ground GND.

According to the above-mentioned transient voltage suppression device, since the third well is connected to the substrate, the leakage current can be directly led out through the metal connecting-wire layer disposed on the front surface of the chip when the diode D1 is forwardly biased, thereby avoiding that the parasitic resistance and inductance affect the chip performance due to the additional metal lead-out lines disposed on the back surface of the substrate. Moreover, since the current capability (the ability to leak a large current) of the silicon-controlled rectifier is stronger than those of ordinary PIN diode and zener diode, the current capability of the negative-impulse ESD can be enormously improved.

In the embodiment shown in FIG. 1, the transient voltage suppression device further includes an epitaxial layer 114 disposed on the substrate 112. The first well 122 and the second well 124 are disposed in the epitaxial layer 114. The epitaxial layer 114 is a second conductivity type epitaxial layer. The doping concentration of the substrate 112 is greater than the doping concentration of the epitaxial layer 114. In the embodiment shown in FIG. 1, the epitaxial layer 114 is a P-epitaxial layer.

In the embodiment shown in FIG. 1, the first conductivity type well region (that is, the first well 122 and the second well 124) is a deep N-type well (DN), and the second conductivity type well region (including the third well 132) is a deep P-type well (DP).

In the embodiment shown in FIG. 1, the first isolation portion 172 and the second isolation portion 174 are isolation structures formed by filling an insulating material in isolating trenches. The insulating material can be silicon dioxide, polysilicon, or the like, or a combination thereof. Referring to FIG. 1, the isolation structure can adopt a single-trench structure as the second isolation portion 174, or can adopt a dual-trench structure as the first isolation portion 172, or even a multi-trench structure. In general, the isolation effect of two or more trenches is better than that of the single trench.

In an embodiment, the second isolation portion 174 has a trench depth greater than or equal to the well depth of the third well 126, in order to obtain a better isolation effect.

In the embodiment shown in FIG. 1, an insulation structure is disposed on the fifth doped region 146.

It is also necessary to provide a method for manufacturing a transient voltage suppression device, which can be used to manufacture the transient voltage suppression device of any one of the above-mentioned embodiments.

Figure 3:
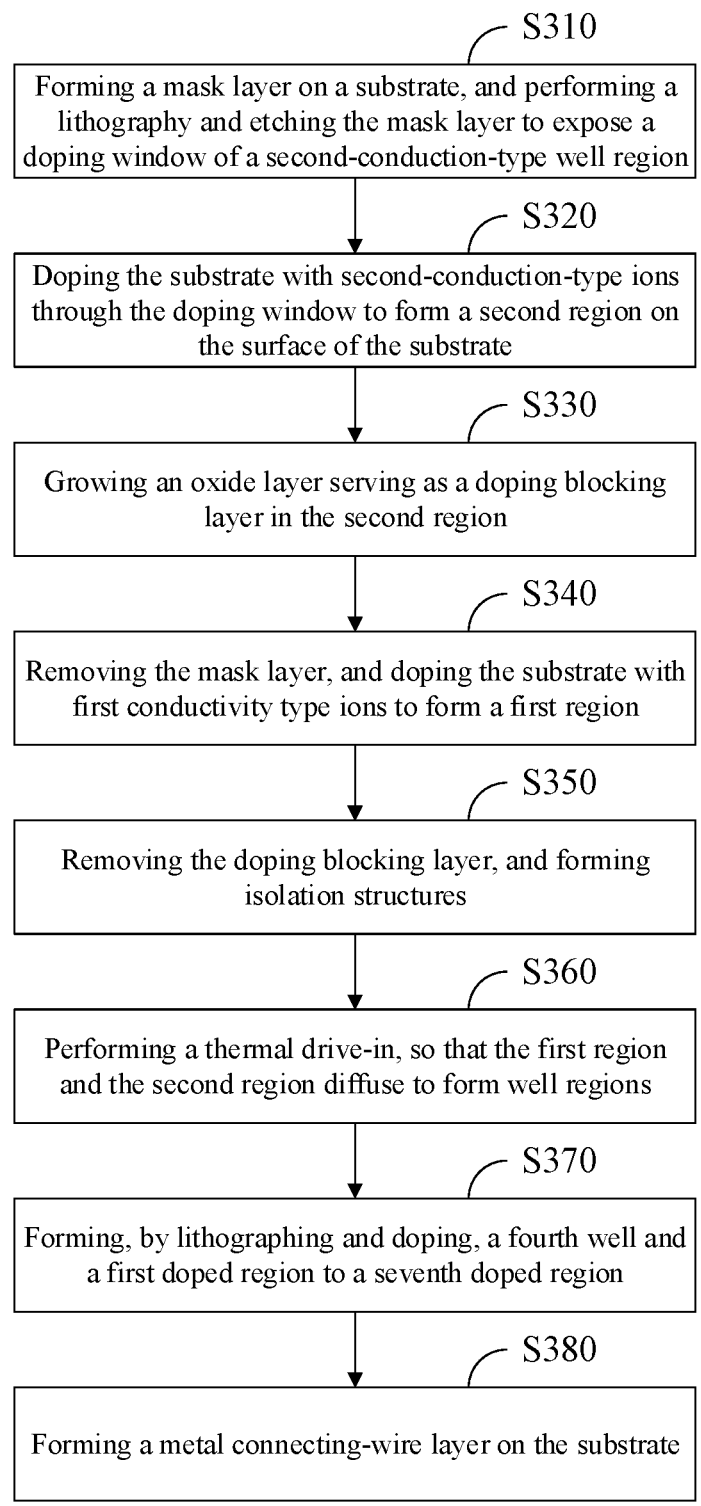
FIG. 3 is a flow chart of a method for manufacturing a transient voltage suppression device according to an embodiment.

FIG. 3 is a flow chart of a method for manufacturing a transient voltage suppression device according to an embodiment. The method includes following steps.

At step S310, a mask layer is formed on a substrate, and a lithography is performed and the mask layer is etched to expose a doping window of a second conductivity type well region.

Figure 4A:
FIGS. 4a to 4d are section diagrams of the transient voltage suppression device manufactured using the method of FIG. 3 during a manufacturing process.
Figure 4B:
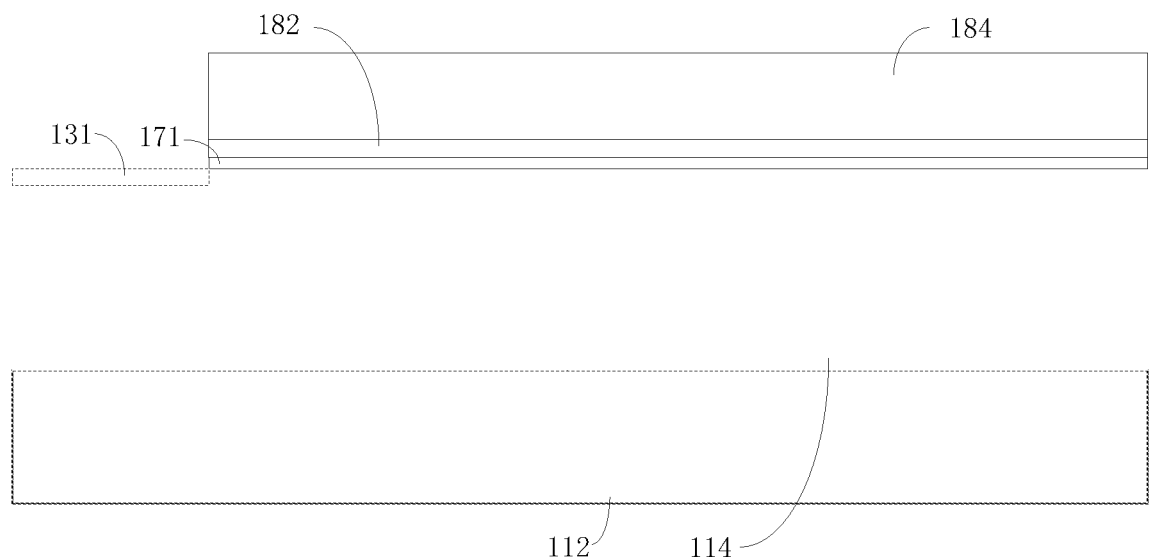

Referring to FIGS. 4a and 4b together, after the mask layer 182 is formed on the substrate, a surface of the mask layer 182 is coated with a photoresist 184. Then, the photoresist 184 is exposed and developed to form a pattern of the doping window of the second conductivity type well region. Next, a portion of the mask layer 182 not covered by the photoresist is etched off to expose the doping window of the second conductivity type well region.

In the embodiment shown in FIG. 4a, an epitaxial layer 114 is further formed on the substrate 112. The doping concentration of the substrate 112 is greater than the doping concentration of the epitaxial layer 114. The mask layer 182 is formed on the epitaxial layer 114.

In the embodiment shown in FIG. 4a, the mask layer 182 is a hard mask. In an embodiment, the hard mask can be a silicon nitride layer. In the embodiment shown in FIG. 4a, before the hard mask is formed, a sacrificial oxide layer 171 can also be formed on the surface of the substrate 112. It also needs to remove the sacrificial oxide layer 171 in corresponding areas when etching at step S310. In an embodiment, the hard mask can be formed by depositing silicon nitride, and the sacrificial oxide layer 171 can be formed by thermally growing an oxide layer.

In an embodiment, the substrate 112 is a semiconductor substrate. The material of the substrate 112 can be undoped monocrystalline silicon, monocrystalline silicon doped with impurities, silicon on insulator (SOD, stacked-silicon on insulator (SSOI), stacked-silicon-germanium on insulator (S—SiGeOI), silicon germanium on insulator (SiGeOI), germanium on insulator (GeOI), or the like.

At step S320, the substrate is doped with second conductivity type ions through the doping window to form a second region on the surface of the substrate.

In this embodiment, the second region 131 is formed on the surface of the epitaxial layer 141 by an ion-implantation process to implant ions of P-type impurities, as shown in FIG. 4b.

At step S330, an oxide layer is grown in the second region, serving as a doping blocking layer.

Figure 4C:
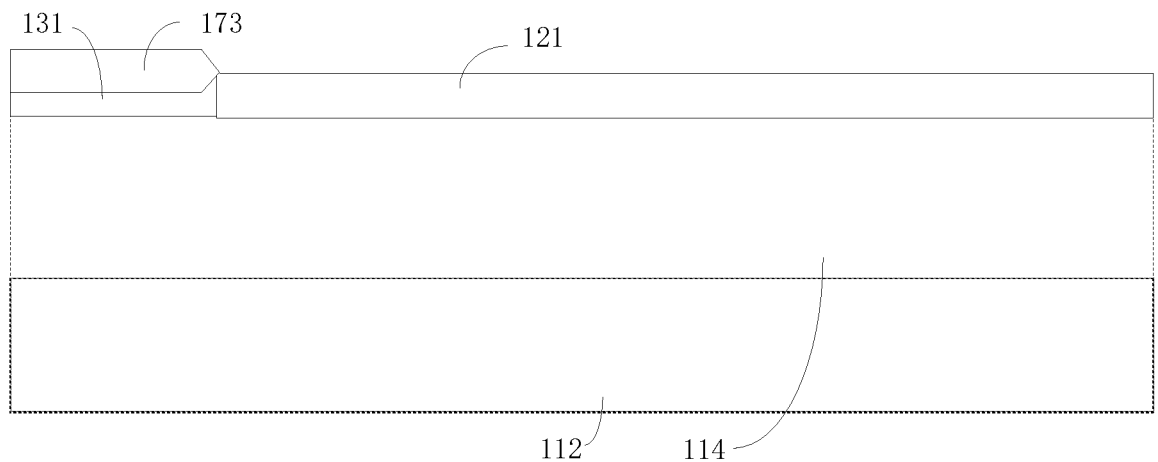

In this embodiment, the oxide layer is grown on the surface of the epitaxial layer 114 after the photoresist 184 is removed. Since the regions outside the doping window of the second conductivity type well region are covered by the mask layer 182 (which is hardly to be oxidized), the doping blocking layer 173 can only be formed in the doping window of the second conductivity type well region, as shown in FIG. 4c.

In an embodiment, at step S330, silicon dioxide having a thickness in a range from 3000 Å to 5000 Å is grown on the surface of the epitaxial layer 114.

At step S340, the mask layer is removed, and the substrate is doped with first conductivity type ions to form a first region.

In this embodiment, ions of N-type impurities are implanted by an ion-implantation process after the mask layer 182 is removed. Referring to FIG. 4c, since the doping blocking layer 173 is formed in the doping window of the second conductivity type well region, the first region 121 can be formed only in the areas outside the second region 131. It can be understood that, in other embodiments, the first region 121 can also be formed by implanting P-type ions, and the second region can be formed correspondingly by implanting N-type ions.

At step S350, the doping blocking layer is removed, and isolation structures are formed.

In an embodiment, the isolation structures include a second isolation portion formed at an interface between the first region 121 and the second region 131, and a first isolation portion dividing the first region 121 into two portions.

At step S360, a thermal drive-in is performed, so that the first region and the second region diffuse to form well regions.

Figure 4D:
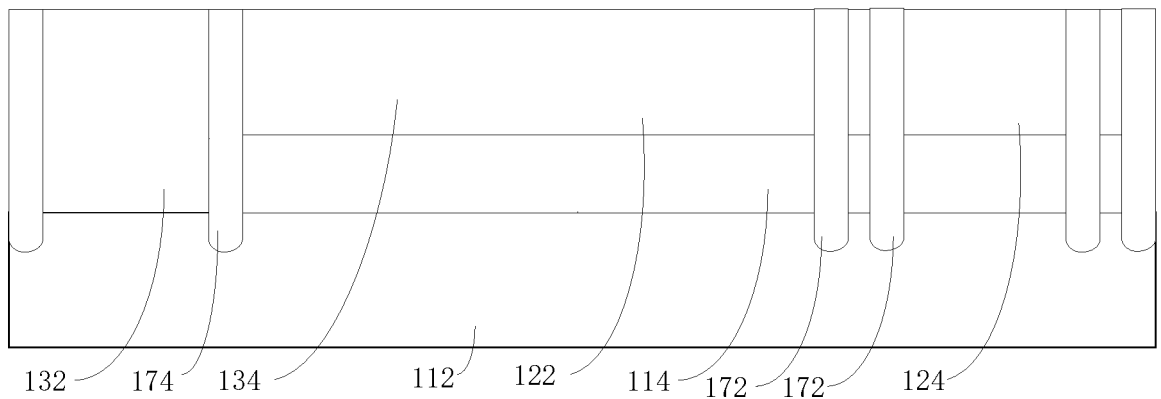

Referring to FIG. 4d, by performing the thermal drive-in, the first region 121 diffuses to form the first well 122 and the second well 124, which are spaced apart from each other by the first isolation portion 172, and the second region 131 diffuses to form the third well 132. In the embodiment shown in FIG. 4d, the first isolation portion 172 and the second isolation portion 174 are isolation structures formed by filling an insulating material in isolating trenches. The insulating material can be silicon dioxide, polysilicon, or the like, or a combination thereof. Referring to FIG. 1, the isolation structure can adopt a single-trench structure as the second isolation portion 174, or can adopt a dual-trench structure as the first isolation portion 172, or even a multi-trench structure. In general, the isolation effect of two or more trenches is better than that of the single trench.

In the embodiment shown in FIG. 4d, after the thermal drive-in is performed, the bottom of the third well 132 extends to the substrate 112.

At step S370, a fourth well and a first doped region to a seventh doped region are formed by lithographing and doping.

Referring to FIG. 1, the first doped region 142 is (a doped region) of a first conductivity type, and is disposed in the second well 124; the second doped region 152 is of the second conductivity type, and is disposed in the third well 132; the third doped region 154 is of the second conductivity type, and is disposed in the fourth well 134; the fourth doped region 144 is of the first conductivity type, and is disposed in the fourth well 134; the fifth doped region 146 is of the first conductivity type, extends from inside of the fourth well 134 to outside of the fourth well 134, and a portion of the fifth doped region 146 outside the fourth well 134 is located in the first well 122, that is, a portion of the fifth doped region 146 is located in 134, and another portion of the fifth doped region 146 is located outside the fourth well 134 and in the first well 122; the sixth doped region 156 is of the second conductivity type, and is disposed in the first well 122; the seventh doped region 157 is of the second conductivity type, and is disposed under the fifth doped region 146 and in the first well 122; and the fifth doped region 146 is disposed between the fourth doped region 144 and the sixth doped region 156, and the fourth doped region 144 is disposed between the third doped region 154 and the fifth doped region 146.

At step S380, a metal connecting-wire layer is formed on the substrate.

In an embodiment, the metal connecting-wire layer includes a first metal connecting-wire 162 and a second metal connecting-wire 164. The first metal connecting-wire 162 electrically connects the first doped region 142 to the sixth doped region 156, and serves as a first potential terminal. The second metal connecting-wire 164 electrically connects the second doped region 152, the third doped region 154, and the fourth doped region 144 to each other, and serves as a second potential terminal.

The above-mentioned method for manufacturing the transient voltage suppression device adopts the thermal drive-in to form a low-capacitance TVS device, thereby requiring for less times of epitaxy, which results in lower costs and simpler process control, and is suitable for mass production. Moreover, the implantation of the DP (including the third well 132) and the DN (including the first well 122 and the second well 124) can be performed with only one photomask, which can save another photomask.

In an embodiment, the doping concentration of the third well 132 is from $5E18\ cm^{-3}$ to $5E19\ cm^{-3}$. Referring to FIG. 1, when the diode D1 is forwardly biased to leak the current, the electron current flows from the input/output terminal I/O through the first doped region 142, the second well 124, the epitaxial layer 114, the substrate 112, the third well 132, and the second doped region 132, to the ground GND. Since the third well 132 (DP) is connected to the substrate 122 (P+), the third well 132 having the high concentration reduces the series resistance of the diode D1. It can be known from the formula $P=I^2R$ that when the power P remains constant, the smaller the resistance R, the larger the current I can flow.

In an embodiment, since the epitaxial layer 114 is disposed between the second well 124 and the substrate 112, when the diode D1 is reversely biased, the concentration of the reverse PN junction formed by the second well 124 and the epitaxial layer 114 is low, thereby resulting in a sufficient depletion and a very small generated parasitic capacitance. In an embodiment, the doping concentrations of the first well 122 and the second well 124 are from $1E14\ cm^{-3}$ to $1E15\ cm^{-3}$, and the doping concentration of the epitaxial layer 114 is from $1E14\ cm^{-3}$ to $1E15\ cm^{-3}$.

In an embodiment, step S370 specifically includes:

lithographing by using a first implantation photomask and implanting P-type ions, then performing a drive-in to form the fourth well 134; removing then the photoresist, and lithographing by using a second implantation photomask and implanting P-type ions to form the second doped region 152, the third doped region 154, and the sixth doped region 156; removing then the photoresist, and lithographing by using a third implantation photomask and implanting N-type ions to form the first doped region 142, the fourth doped region 144, and the fifth doped region 146; and removing then the photoresist, and lithographing by using a fourth implantation photomask and implant P-type ions to form the seventh doped region 157.

In an embodiment, step S380 includes: performing a lithograph and etching, forming a second isolating trench at an interface between the first region 121 and the second region 131, and forming a first isolating trench dividing the first region 121 into two portions; and filling the trenches with an insulating material.

In an embodiment, at step S350 before the lithography, a layer of silicon dioxide is deposited first. Then, an etching region for the isolating trenches are in turn formed by coating, exposing and developing, and a dry-etching is performed to form the deep trenches. Next, the deep trenches are filled with the insulating material. Then, the filled insulating material is dry-etched back to planarize the surface of wafer. By means of the deep-trench isolation technology, the third well 132 and the first well 122 is completely isolated from each other, thereby avoiding the increase of the required area of the chip caused by the increase of the lateral diffusion in the process of the drive-in at high temperature, which is due to the very high concentration of the third well 132.

In an embodiment, at step S370, an implantation amount of the ion-implantation to form the seventh doped region 157 is from $1E14\ cm^{-2}$ to $5E14\ cm^{-2}$. An implantation amount of the ion-implantation to form the fourth well 134 is from $5E12\ cm^{-2}$ to $5E13\ cm^{-2}$. The implantation amount for the seventh doped region 157 is formed by adjusting the ion-implantation. The triggering voltage of SCR can be adjusted accurately to implement TVS protection devices in different grades (that is, suitable for different working voltages).

In an embodiment, after step S370 and prior to step S380, the method further includes following steps.

A dielectric layer is formed. Specifically, an interlayer dielectric (ILD) can be formed by using a deposition process.

A contact via is formed, and a conductive material is filled into the contact via. Specifically, the contact via can be formed by etching the dielectric layer after lithographing. The conductive material can be any suitable conductive material well known to those skilled in the art, including but not limited to metal. The metal can include one or more of Ag, Au, Cu, Pd, Pt, Cr, Mo, Ti, Ta, W and Al. In an embodiment, the dielectric layer is etched by a dry-etching process.

In an embodiment, at step S380, the metal connecting-wire layer is formed on the dielectric layer. Specifically, after the deposition of the metal layer, a lithography can be performed and the metal layer can be etched to form the metal interconnecting-wires. In an embodiment, the metal layer is etched by a dry-etching process.

In an embodiment, after the metal interconnecting-wires are formed, the method further includes a step of forming a passivation layer and a step of performing lithography and etching the passivation layer to form a metal electrode contact.

In an embodiment, the interlayer dielectric can be an oxide silicon layer, including a doped or undoped material layer of oxide silicon, which is formed by a thermal chemical vapor deposition (thermal CVD) process or a high-density plasma (HDP) process, for example, undoped silicon glass (USG), phosphosilicate glass (PSG) or borophosphosilicate glass (BPSG). In addition, the interlayer dielectric can also be spin-on glass (SOG) doped with boron or doped with phosphorus, tetraethoxysilane (PTEOS) doped with phosphorus, or tetraethoxysilane (BTEOS) doped with boron.

In an embodiment, the deposited interlayer dielectric can also be planarized by a planarization method (for example, chemical mechanical polishing (CMP)), so that the interlayer dielectric has a planar surface.

The above-mentioned embodiments only express several implementations of the present disclosure, and the description is comparably specific and detailed, but it should not be interpreted as a limitation on the scope of the present disclosure. It should be pointed out that for those of ordinary skill in the art, without departing from the concept of the present disclosure, several modifications and improvements can be made, and these all fall within the protection scope of the present disclosure. Therefore, the protection scope of the disclosure should be subject to the appended claims.

What is claimed is:

1. A transient voltage suppression device, comprising:
a substrate, the substrate being of a second conductivity type;
a first conductivity type well region disposed on the substrate and including a first well and a second well;
a third well disposed on the substrate and being of the second conductivity type, a bottom of the third well extending to the substrate, the first conductivity type and the second conductivity type being conductivity types opposite to each other;
a fourth well disposed in the first well and being of the second conductivity type;
isolation structures, the isolation structures comprising a first isolation portion disposed between the first well and the second well, and a second isolation portion disposed between the first well and the third well, the first isolation portion being adapted to isolate the first well and the second well from each other, and the second isolation portion being adapted to isolate the first well and the third well from each other;
a first doped region being of a first conductivity type and disposed in the second well;
a second doped region being of the second conductivity type and disposed in the third well;
a third doped region being of the second conductivity type and disposed in the fourth well;
a fourth doped region being of the first conductivity type and disposed in the fourth well;
a fifth doped region being of the first conductivity type, extending from inside of the fourth well to outside of the fourth well, and a portion of the fifth doped region outside the fourth well being located in the first well;
a sixth doped region being of the second conductivity type and disposed in the first well;
a seventh doped region being of the second conductivity type and disposed under the fifth doped region and in the first well, the fifth doped region being disposed between the fourth doped region and the sixth doped region, the fourth doped region being disposed between the third doped region and the fifth doped region;
a metal connecting-wire layer comprising a first metal connecting-wire and a second metal connecting-wire and located on the substrate, the first metal connecting-wire being electrically connected to the first doped region and the sixth doped region and serving as a first potential terminal, the second metal connecting-wire layer being electrically connected to the second doped region, the third doped region and the fourth doped region and serving as a second potential terminal.

2. The transient voltage suppression device of claim 1, wherein the first potential terminal is adapted to be electrically connected to an input/output terminal, and the second potential terminal is adapted to be connected to ground.

3. The transient voltage suppression device of claim 1, wherein the device further comprises an epitaxial layer disposed on the substrate, the first conductivity type well region being disposed in the epitaxial layer, the epitaxial layer being of the second conductivity type, the substrate having a doping concentration greater a doping concentration of the epitaxial layer.

4. The transient voltage suppression device of claim 1, wherein the isolation structures are those formed by filling an insulating material in isolating trenches.

5. The transient voltage suppression device of claim 4, wherein the second isolation portion has a trench depth greater than or equal to a well depth of the third well.

6. The transient voltage suppression device of claim 1, wherein the first doped region is used as a cathode region of a diode D1, the second doped region is used as an anode region of the diode D1, the sixth doped region is used as an emitter region of a PNP transistor, the fifth doped region is used as a base region of the PNP transistor and used as a collector region of an NPN transistor and a cathode region of a zener diode Z1, the seventh doped region is used as a collector region of the PNP transistor and used as a base region of the NPN transistor and an anode region of the zener diode Z1, and the fourth doped region is used as an emitter region of the NPN transistor; an equivalent parasitic resistance R1 is formed between the seventh doped region and the third doped region, and an equivalent diode D2 is formed between the sixth doped region and the fifth doped region; and the PNP transistor and the NPN transistor are equal to a silicon controlled rectifier.

7. The transient voltage suppression device of claim 1, wherein the device further comprises an insulating structure disposed on the fifth doped region.

8. The transient voltage suppression device of claim 1, wherein the third well has a doping concentration in a range from $5E18$ $cm^{-3}$ to $5E19$ $cm^{-3}$.

9. The transient voltage suppression device of claim 3, wherein the first well and the second well have a doping concentration in a range from $1E14$ $cm^{-3}$ to $1E15$ $cm^{-3}$, and the epitaxial layer has a doping concentration in a range from $1E14$ $cm^{-3}$ to $1E15$ $cm^{-3}$.

10. A method for manufacturing a transient voltage suppression device, comprising:
forming a mask layer on a substrate of a second conductivity type, and then performing lithography and etching the mask layer to expose a doping window of a second conductivity type well region;

doping the substrate with second conductivity type ions through the doping window of the second conductivity type well region to form a second region on a surface of the substrate;

growing an oxide layer as a doping blocking layer in the second region;

removing the mask layer, and doping areas of the surface of the substrate not covered by the doping blocking layer with first conductivity type ions to form a first region, the first conductivity type and the second conductivity type being conductivity types opposite to each other;

removing the doping blocking layer, and forming isolation structures, the isolation structures comprising a second isolation portion extending downwardly from an interface between the first region and the second region, and a first isolation portion dividing the first region into two portions;

performing a thermal drive-in, so that the first region diffuses to form a first well and a second well which are spaced from each other by the first isolation portion, and the second region diffuses to form a third well;

forming, by lithographing and doping, respectively a fourth well, a first doped region, a second doped region, a third doped region, a fourth doped region, a fifth doped region, a sixth doped region, and a seventh doped region;

forming a metal connecting-wire layer on the substrate, the metal connecting-wire layer including a first metal connecting-wire and a second metal connecting-wire, the first metal connecting-wire electrically connecting the first doped region to the sixth doped region as being used as a first potential terminal, and the second metal connecting-wire electrically connecting the second doped region, the third doped region and the fourth doped region to each other as being used as a second potential terminal;

wherein the fourth well is of the second conductivity type, and is formed in the first well; the first doped region is of the first conductivity type, and is formed in the second well; the second doped region is of the second conductivity type, and is formed in the third well; the third doped region is of the second conductivity type, and is formed in the fourth well; the fourth doped region is of the first conductivity type, and is formed in the fourth well; the fifth doped region is of the first conductivity type, extends from inside of the fourth well to outside of the fourth well, and a portion of the fifth doped region outside the fourth well is located in the first well; the sixth doped region is of the second conductivity type, and is formed in the first well; a seventh doped region is of the second conductivity type, and is formed under the fifth doped region and in the first well; and the fifth doped region is formed between the fourth doped region and the sixth doped region, and the fourth doped region is formed between the third doped region and the fifth doped region.

11. The method for manufacturing the transient voltage suppression device of claim 10, wherein the substrate comprises a bottom substrate and an epitaxial substrate disposed on the bottom substrate, and the bottom substrate has a doping concentration greater than a doping concentration of the epitaxial substrate; and the third well formed at the step of performing the thermal drive-in extends to the bottom substrate, the first well and the second well are formed in the epitaxial substrate, and the step of forming the metal connecting-wire layer on the substrate is forming the metal connecting-wire layer on the epitaxial substrate.

12. The method for manufacturing the transient voltage suppression device of claim 10, wherein the forming the mask layer on the substrate of the second conductivity type is forming a silicon nitride layer by deposition.

13. The method for manufacturing the transient voltage suppression device of claim 10, wherein the first conductivity type is N-type, and the second conductivity type is P-type, and the step of forming, by lithographing and doping, respectively the fourth well, the first doped region, the second doped region, the third doped region, the fourth doped region, the fifth doped region, the sixth doped region, and the seventh doped region, comprises lithographing by using a first implantation photomask and implanting ions, and then performing a drive-in to form the fourth well;

lithographing by using a second implantation photomask, and implanting ions to form the second doped region, the third doped region, and the sixth doped region;

lithographing by using a third implantation photomask, and implanting ions to form the first doped region, the fourth doped region, and the fifth doped region; and lithographing by using a fourth implantation photomask, and implanting ions to form the seventh doped region.

14. The method for manufacturing the transient voltage suppression device of claim 13, wherein an implantation amount taken by the step of lithographing by using the first implantation photomask and implanting the ions is in a range from $5E12$ cm$^{-2}$ to $5E13$ cm$^{-2}$; and an implantation amount taken by the step of lithographing by using the fourth implantation photomask and implanting the ions is in a range from $1E14$ cm$^{-2}$ to $5E14$ cm$^{-2}$.

15. The method for manufacturing the transient voltage suppression device of claim 10, wherein the step of forming the isolation structures comprises:

performing lithography and etching to form a second isolating trench at an interface between the first region and the second region and to form a first isolating trench dividing the first region into two portions; and filling the trenches with an insulating material.

* * * * *